United States Patent [19]

Ham, Jr. et al.

[11] Patent Number: 5,477,150
[45] Date of Patent: Dec. 19, 1995

[54] ELECTRIC ARC AND RADIO FREQUENCY SPECTRUM DETECTION

[75] Inventors: Howard M. Ham, Jr., Santa Ynez; James J. Keenan, Santa Barbara, both of Calif.

[73] Assignee: Hendry Mechanical Works, Goleta, Calif.

[21] Appl. No.: 266,249

[22] Filed: Jun. 27, 1994

Related U.S. Application Data

[62] Division of Ser. No. 30,279, Mar. 18, 1993, Pat. No. 5,373,241.

[30] Foreign Application Priority Data

Oct. 24, 1990 [EP] European Pat. Off. ............... 90917578

[51] Int. Cl.$^6$ .................................................. G01R 23/00
[52] U.S. Cl. ........................ 324/536; 324/613; 324/501; 324/520; 324/76.23; 455/67.3
[58] Field of Search ...................................... 455/304, 306, 455/303, 67.3; 324/536, 520, 529, 501, 76.23, 613

[56] References Cited

U.S. PATENT DOCUMENTS

| | | |
|---|---|---|
| 1,462,053 | 7/1923 | Stoller . |
| 3,308,345 | 3/1967 | Warrington . |
| 3,555,413 | 1/1971 | Matsuba . |
| 3,728,620 | 4/1973 | Heins . |
| 3,751,606 | 8/1973 | Kaiser, Jr. . |

(List continued on next page.)

FOREIGN PATENT DOCUMENTS

| | | |
|---|---|---|
| 480225 | 6/1975 | Australia . |
| 0064198 | 11/1982 | European Pat. Off. . |
| 0249815 | 12/1987 | European Pat. Off. . |
| 0258023 | 3/1988 | European Pat. Off. . |
| 2451584 | 10/1980 | France . |
| 60-62050 | 8/1985 | Japan . |
| 64-41872 | 5/1989 | Japan . |
| 1131467 | 8/1989 | Japan . |
| 1278222 | 1/1990 | Japan . |
| 2212999 | 8/1989 | United Kingdom . |
| 2235342 | 2/1991 | United Kingdom . |
| 8707986 | 12/1987 | WIPO . |
| 8908848 | 9/1989 | WIPO . |
| 9004278 | 4/1990 | WIPO . |

OTHER PUBLICATIONS

Cristopher Schiebold, "Theory and Design of the Delay Line Discriminator for Phase Noise Measurements." 176 Microwave J., vol.26(1983).

Chong-Yung Chi, et al, "Roundoff Noise Analysis for Digital Signal Power Processors, etc.", IEEE Trans. ASSP-35 (1987) No.6, pp. 784-794.

Motorola Linear and Interface Intergrated Circuits Catalog (1988) pp. 8-65 to 8-70 and 2-57 to 2-60.

RF/IF Signal Processing Guide, SF-89/90, pp. 8 etc., 1989.

Microwaves & RF (Jul. 1990) F132-2.

*Primary Examiner*—Kenneth A. Wieder
*Assistant Examiner*—Jose M. Solis
*Attorney, Agent, or Firm*—Benoit Law Corporation

[57] ABSTRACT

A principal object of the invention is to detect sparks or arcs (12) in electric circuits (13) or otherwise to detect a spectrum of a broad band of distinct instaneous radio frequencies in radio frequency noise. The invention rejects extraneous narrow-band signals having frequencies within the broad band, such as by means of filters (21, 27, 29) or a balanced mixer arrangement (32-39). The mixer 37 may be fed from a radio frequency signal duplicator (32, 33, 34) having an input (25) coupled to a source of the spectrum, a first output for one spectrum as duplicated by that duplicator connected to one mixer input (35), and a second output for the other spectrum as duplicated by that duplicator connected to tile other mixer input (36). Alternatively, the radio frequency mixer (37) may receive the output of a wide band noise generator (68) at its other input (36, FIG. 5). A combination of multitude of the distinct instantaneous radio frequencies indicative of the spectrum or the arc (12) is detected, such as with a frequency combination detector (42) having an input (40) coupled to the radio frequency mixer output (38).

21 Claims, 5 Drawing Sheets

U.S. PATENT DOCUMENTS

| | | |
|---|---|---|
| 3,820,018 | 6/1974 | Beasley et al. . |
| 3,869,665 | 3/1975 | Kenmochi et al. . |
| 3,904,839 | 9/1975 | Peoples . |
| 4,006,410 | 2/1977 | Roberts .................................... 324/536 |
| 4,072,899 | 2/1978 | Shimp . |
| 4,229,626 | 10/1980 | Peoples . |
| 4,466,071 | 8/1984 | Russell, Jr. . |
| 4,543,524 | 9/1985 | Bulley . |
| 4,609,866 | 9/1986 | Loftness . |
| 4,785,223 | 11/1988 | Hank et al. . |
| 4,967,158 | 10/1990 | Gonzalez . |
| 5,185,684 | 2/1993 | Beihoff ..................................... 324/536 |

ELECTRIC ARC AND RADIO FREQUENCY SPECTRUM DETECTION

CROSS REFERENCE

This is a Division of Application 08/030,279, filed Mar. 18, 1993 by Howard M. Ham, Jr., and James J. Keenan, now U.S. Pat. No. 5,373,241, under priority of International Application PCT/US90/06113, filed Oct. 24, 1990 by the common assignee and herewith incorporated by reference herein.

FIELD OF THE INVENTION

The subject invention relates to the detection of radio frequency spectra and of electric arcs, and to systems for acting in response to such radio frequency spectra or to systems for preventing damage from electric arcs.

BACKGROUND

Given the fact that electric arcs or sparks were the first means for wireless communication, it may be surprising that there persisted a need for detecting a spectrum of radio frequencies in radio frequency noise, such as generated by an electric arc in an electric circuit. However, such a persisting need has been particularly emphasized by electrical fires and other serious damage caused by accidental arcs in electric power supply systems and other circuits. In this respect, while fuses and circuit breakers are capable of preventing serious overload conditions, they have been generally ineffective to prevent electrical fires and other damage from accidental arcs and sparks which frequently occur and persist at current levels below the level at which the fuse will blow or the circuit breaker has been set to trip.

On the other hand, electrical fault detection has been practiced for a long time. For instance, U.S. Pat. Nos. 1,462,053, by H. M. Stoller, issued Jul. 17, 1923, and 3,308,345 by A. R. Van Cortlandt Warrington, issued Mar. 7, 1967, show different uses of resonant circuitry for fault detection. U.S. Pat. No. 3,728,620, by J. L. Heins, issued Apr. 17, 1973, constitutes the transmission line as a resonant circuit for fault indication and location, utilizing a variable frequency source coupled to one end of the line. U.S. Pat. Nos. 3,751,606, by C. W. Kaiser, Jr., issued Aug. 7, 1973, and 3,904,839, and 4,229,626, by J. T. Peoples, issued Sep. 9, 1975 and Oct. 21, 1980, respectively, disclose loop fault locators using demodulators, phase comparators, and other electronic circuits.

U.S. Pat. No. 4,006,410, by D. R. Roberts, issued Feb. 8, 1977, proposed pinpointing the location of corona discharges in an electrical system by processing only those high-frequency components that do not propagate along the wires of the system. U.S. Pat. No. 4,466,071, by B. D. Russell, Jr., issued Aug. 14, 1984, disclosed high impedance fault detection apparatus and methods using a microcomputer system. U.S. Pat. No. 4,543,524 by R. M. Bulley, issued Sep. 24, 1985, may be noted as of interest in the spectrum analyzer area.

Despite this wealth of information and prior proposals, electrical fires and other damage caused by arcs and sparks have continued to devastate electric power supply and other systems, as well as buildings housing them and forests and neighborhoods in which they are located.

Also, vulnerability to false alarms has been a discouraging problem, inasmuch as switching transients, emissions from radio and television transmitters and other sources can easily trigger false alarms in arc detectors.

In another vein, machinery, circuitry, and apparatus often break down and become damaged in a manner or to an extent that could have been prevented if there had been an early detection of unusual arcing. For instance, commutators of electric motors are often damaged when their carbon brushes wear out, since the metallic brush holder springs then rub against the commutator. Since such wear is accompanied by heavy arcing, an early detection of such arcing could signal the need for preventive action. This is, of course, only a representative example of fields where reliable arc detection could be useful.

SUMMARY OF THE INVENTION

It is a general object of this invention to overcome the disadvantages and to meet the needs set forth above or otherwise expressed or implicit herein.

It is a germane object of this invention to provide improved methods and apparatus for detecting a spectrum of distinct instantaneous radio frequencies in radio frequency noise.

It is a related object of this invention to provide improved methods and apparatus for detecting the occurrence of arcs in electric circuits.

Other objects of the invention will become apparent in the further course of this disclosure.

The subject invention resides in methods and apparatus for detecting a spectrum of a broad band of distinct instantaneous radio frequencies in radio frequency noise, comprising in combination the steps of, or means for, rejecting extraneous narrow-band signals having frequencies within that broad band, converting a multitude of the distinct instantaneous radio frequencies into a combination frequency of these distinct instantaneous radio frequencies, and detecting said spectrum from that combination frequency.

From a similar aspect thereof, the invention resides in apparatus for detecting a spectrum of a broad band of distinct instantaneous radio frequencies in radio frequency noise, comprising in combination a radio frequency signal duplicator having an input coupled to a source of that spectrum, a first output for one spectrum as duplicated by that duplicator, and a second output for the other spectrum as duplicated by that duplicator, a radio frequency mixer having a first radio frequency input coupled to said first output, a second radio frequency input coupled to said second putput, and a radio frequency mixer output for a combination of radio frequencies applied to those first and second inputs, and a frequency combination detector having an input coupled to the radio frequency mixer output, and having an output for a detected combination of the distinct instantaneous radio frequencies indicative of said noise.

BRIEF DESCRIPTION OF THE DRAWINGS

The subject invention and its various objects and aspects will become more readily apparent from the following detailed description of preferred embodiments thereof, illustrated by way of example in the accompanying drawings, in which like reference numerals designate like or equivalent parts, and in which.

DESCRIPTION OF PREFERRED EMBODIMENTS

The drawings illustrate methods and apparatus for detecting and acting on spectra of a broad band of distinct instantaneous radio frequencies in radio frequency noise, and also show methods and apparatus for detecting the occurrence of arcs or sparks in electric circuits, all pursuant to presently preferred embodiments of the subject invention.

In the further course of this disclosure, it will be seen more specifically that these methods and apparatus reject extraneous narrow-band signals having frequencies within the broad band, and detect from the radio frequency noise a combination of a multitude of the distinct instantaneous radio frequencies indicative of the spectrum. For the detection of the occurrence of an electric arc, the illustrated methods and apparatus work from the spectrum of a broad band of distinct instantaneous radio frequencies generated by such arc, and detect an occurrence of that arc by detecting the combination of a multitude of the distinct instantaneous radio frequencies from the broad band of distinct instantaneous radio frequencies generated by that electric arc.

In this respect, electric currents in a circuit and touching wires, loose connections, interruptions, worn carbon brushes, defective or excessively bouncing contacts and other imperfections may generate electric arcs or sparks which, in turn, generate radio frequency (RF) noise which is radiated from the arc and/or travels along the conductors of that electric circuit in accordance with a skin effect. In practice, RF noise generated by an electric arc or spark (hereinafter simply referred to as "arc") comprises a spectrum of a broad band of distinct instantaneous radio frequencies, herein called the "RF signature" of the arc.

Figure 1:
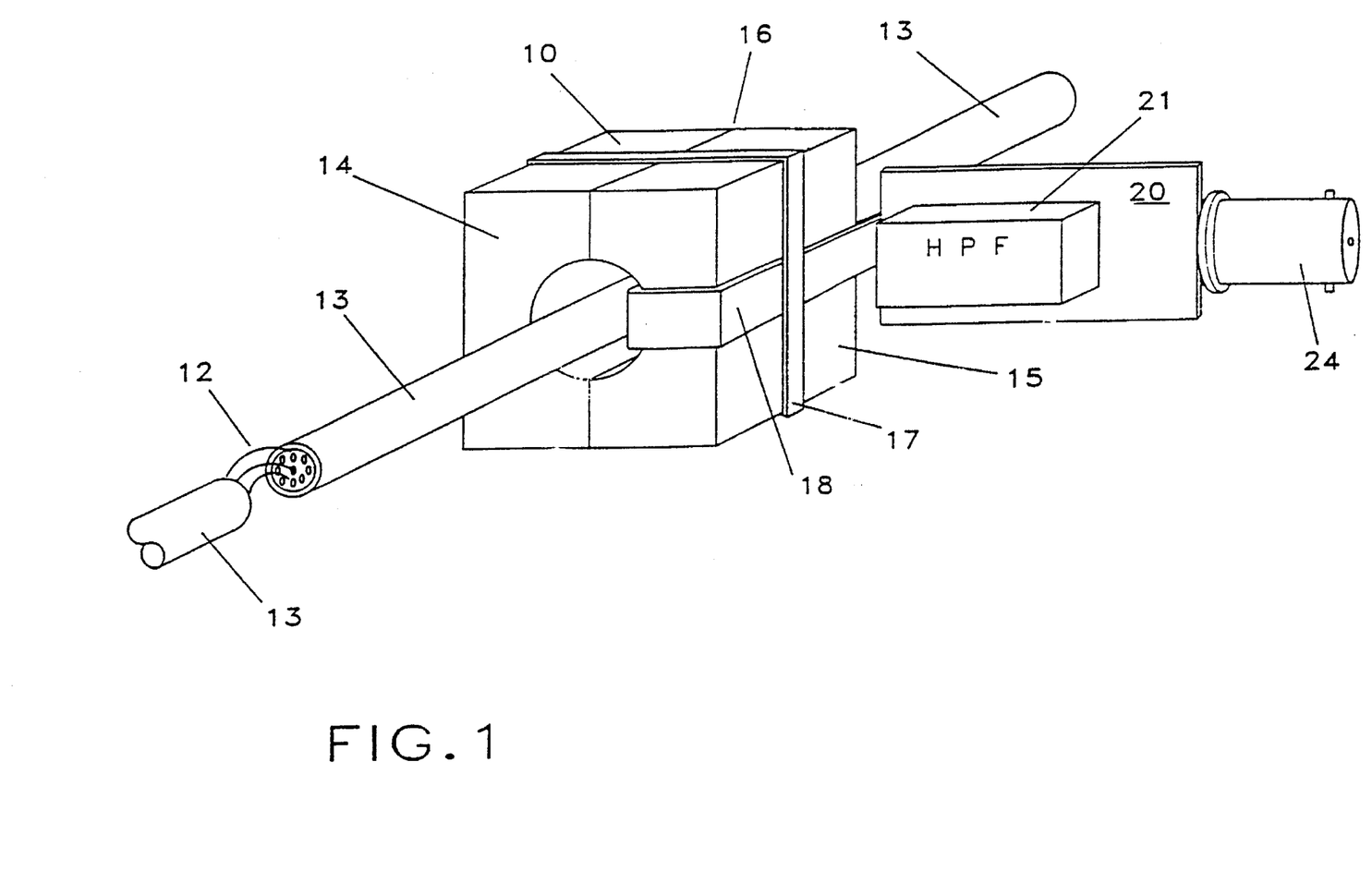
FIG. 1 is a perspective view of an RF pickup of the arc signature according to an embodiment of the subject invention.

A sample of the RF signature of the arc can be picked up with an antenna, a near field capacity coupler, a ferrite core RF transformer, or another RF energy pickup. By way of example, and not by way of limitation, FIG. 1 shows a ferrite core RF transformer 10 for picking up the RF signature of an arc 12 formed in an interruption or other fault between or in circuit wires 13 carrying a load current, or formed by excessive arcing of a switch, commutator or other component. The illustrated transformer 10 comprises a ferrite block composed of core halves 14 and 15 joined along a slice line 16 and held together by a tie wrap 17. The wire 13 in effect acts as a primary winding and a copper strap pickup link 18 acts as a secondary winding of the transformer 10.

Figure 2:
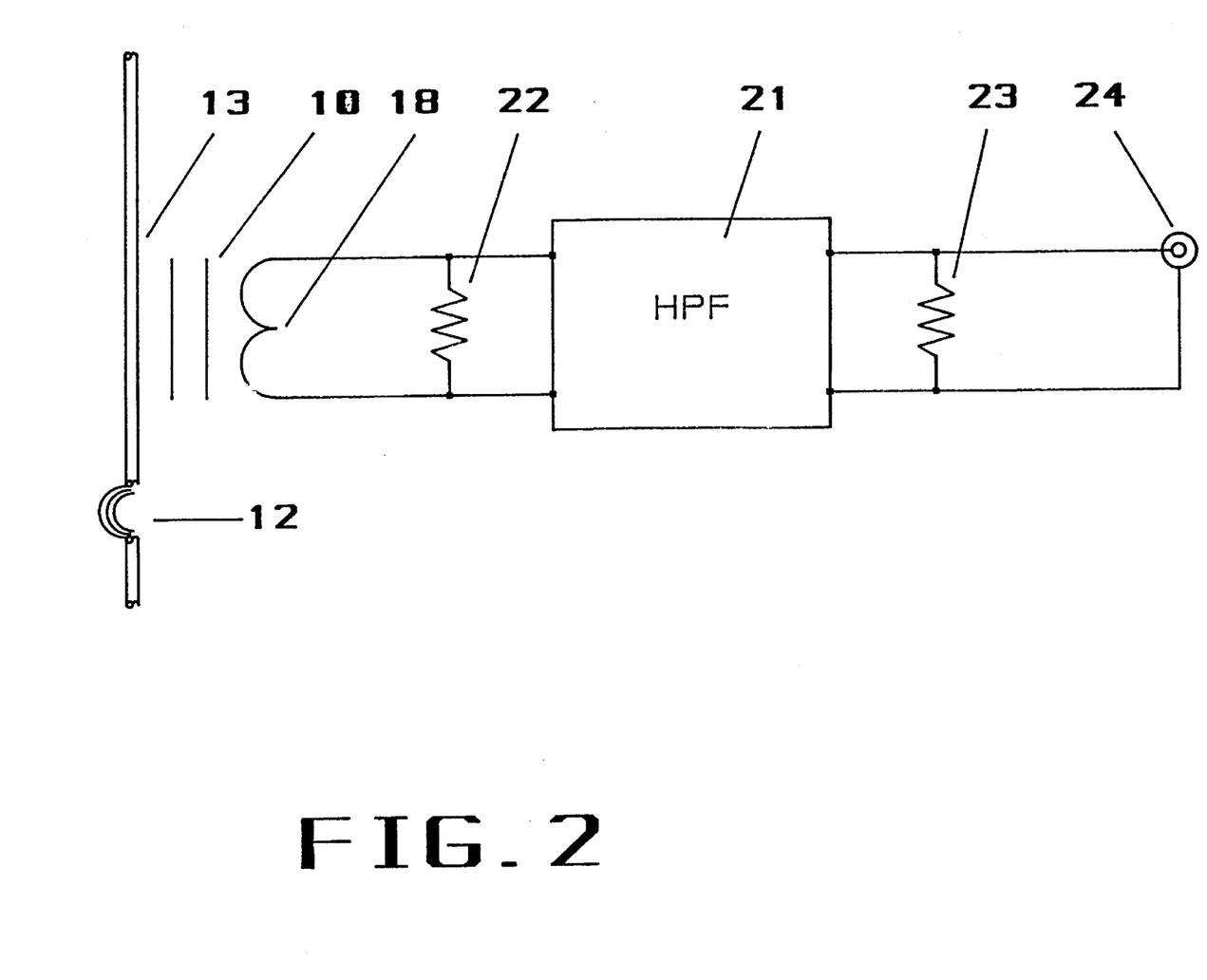
FIG. 2 is a circuit diagram of the pickup of FIG. 1.

FIG. 2 is a circuit diagram of the pickup shown in FIG. 1. The circuit board 20 shown in FIG. 1 carries a filter 21, including input and output matching resistors 22 and 23, and feeding into a pickup output terminal 24. The filter 21 and subsequent filters shown in the drawings have the purpose of assuring that difference frequencies detected as indicative of an arc 12 cannot be simulated in the circuitry by extraneous noise having the same frequency. For instance, there are commercial transmitters and other radio frequency sources that emit signals at frequencies similar to the difference frequency to be detected by the circuitry presently to be described. None of these extraneous signals are to influence the operation of such detection circuitry. High pass or bandpass filters may be used for this purpose. By way of example, the filter 21 and other filters used for the same purpose in the circuitry presently to be described may be designed to eliminate frequencies below 20 MHz, and to pass frequencies from 20 MHz up, if a difference frequency in the area of 10 MHz is used for example, as more fully described below. In general terms, embodiments of the invention substantially eliminate from the radio frequency noise those components that have a frequency of the combination of the distinct instantaneous radio frequencies as more fully described below.

By way of example, RF components of arc currents reside within a spectral range of from 1 MHz through 500 MHz. In the illustrated embodiment, the RF components below 20 MHz are reduced by the high pass filter 21. The arc signature components of 20 MHz and higher are coupled via connectors 24 and 25 to the input of the amplifier, filter and assembly shown in FIG. 3. In particular, the filtered RF signature is applied from the pickup output connector 24 to the input connector 25 of a wide band input transformer 26 (XFMR). In an embodiment of the invention, the detector will respond to an arc noise power spectrum level averaging −70 dbm in the 20 MHz to 200 MHz range.

Figure 3:
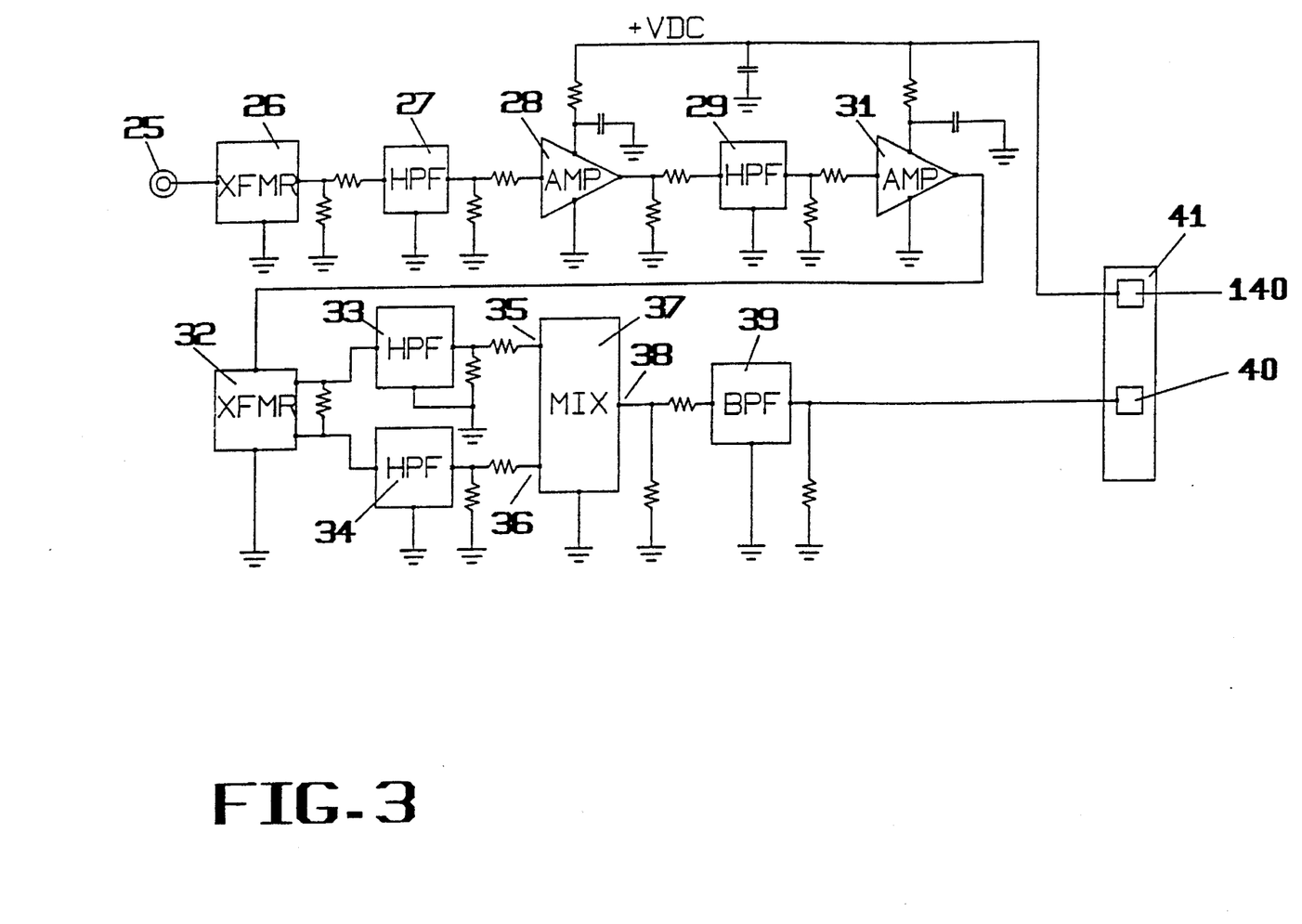
FIG. 3 is a block diagram of an amplifier, filter and mixer assembly according to an embodiment of the invention.

The output signal of the input transformer 26 is applied to the first gain stage 28 via another 20 MHz high pass filter 27 to further red,ice signal and/or impulse noise in the spectrum below 20 MHz. That stage 28 preferably is a sealed amplifier module providing 28 db of stable, broadband gain from 0.5 MHz to 500 MHz. This amplifier drives the next 20 MHz high pass filter 29 which in turn drives another 28 db broadband amplifier 31. That second amplifier 31 drives a 1:1 interstage transformer 32. The secondary of that transformer operates in an ungrounded balanced configuration driving two 20 MHz high pass filters 33 and 34 in push-pull. The drive source impedance into each filter is influenced by the terminating impedance presented by the opposite filter. These filters 33 and 34 drive the two input ports 35 and 36 of a balanced mixer 37. Thus the signal level in the region below 20 MHz, applied to either input port of the balanced mixer is attenuated by more than the out-of-band attenuation of a single 20 MHz high pass filter. The output 38 of the mixer 37 is applied to a bandpass filter 39.

FIG. 3 is representative of methods and apparatus for mixing the radio frequency noise with a duplicate thereof, and detecting from such mixed radio frequency noise the difference or other combination of a multitude of the distinct instantaneous radio frequencies. FIG. 3 and equivalents thereof duplicate the radio frequency noise into two paths, such as at 32, 33, 35 and 34, 36, and mix the radio frequency noise from one of such two paths with the radio frequency noise from the other of these two paths to produce a difference or other combination of a multitude off the distinct instantaneous radio frequencies in the are signature or other radio frequency noise.

Throughout the radio frequency processing system care is taken to minimize signal components and gain availability in the region below 20 MHz. When a wideband noise power spectrum averaging −70 dbm in the range of 0.5 MHz through 200 MHz is applied to the RF input transformer 26, the signal applied to each input of the mixer 37 is −35 dbm to −40 dbm in the 20 MHz through 200 MHz region. Below 20 MHz the signal level is less than −70 dbm at each mixer input. The output of the bandpass filter 39 is −50 dbm to −55 dbm centered at the passband of the filter 39. A conversion loss of 15 db is correct considering the input levels being applied to the balanced mixer. The term "conversion" is a well-known expression for the frequency conversion that occurs, for instance, in frequency mixers combining two input signals to convert their frequency to their difference frequency or to another combination frequency, such as herein disclosed. In the illustrated embodiment, the output of the frequency converter or mixer 37 is the result of an instantaneous difference frequency between any two or more of the nearly continuous noise pulses which make up the wide band RF signature of the arc being detected.

Extraneous inputs such as relay transients, switch noise, motor brush noise, outside radio transmissions, etc., produce narrow band signals which arrive at the mixer inputs 35 and 36 as common mode inputs. Such signals tend to cancel within the balanced mixer 37 or, if slightly offset in time or frequency, do not produce a significant signal at the difference frequency level. The result is a system that responds to low level, wide band inputs that are the RF signature of an arc, but will not respond to much higher levels of extraneous interference. This provides the stability and false output immunity required.

A preferred embodiment of the invention selected an instantaneous difference frequency of 10.7 MHz for the mixer 38 and bandpass filter 39. This is a commonly used IF frequency for which components are commercially available and which is protected by international convention. Other protected IF frequencies may be used for this purpose.

Figure 4:
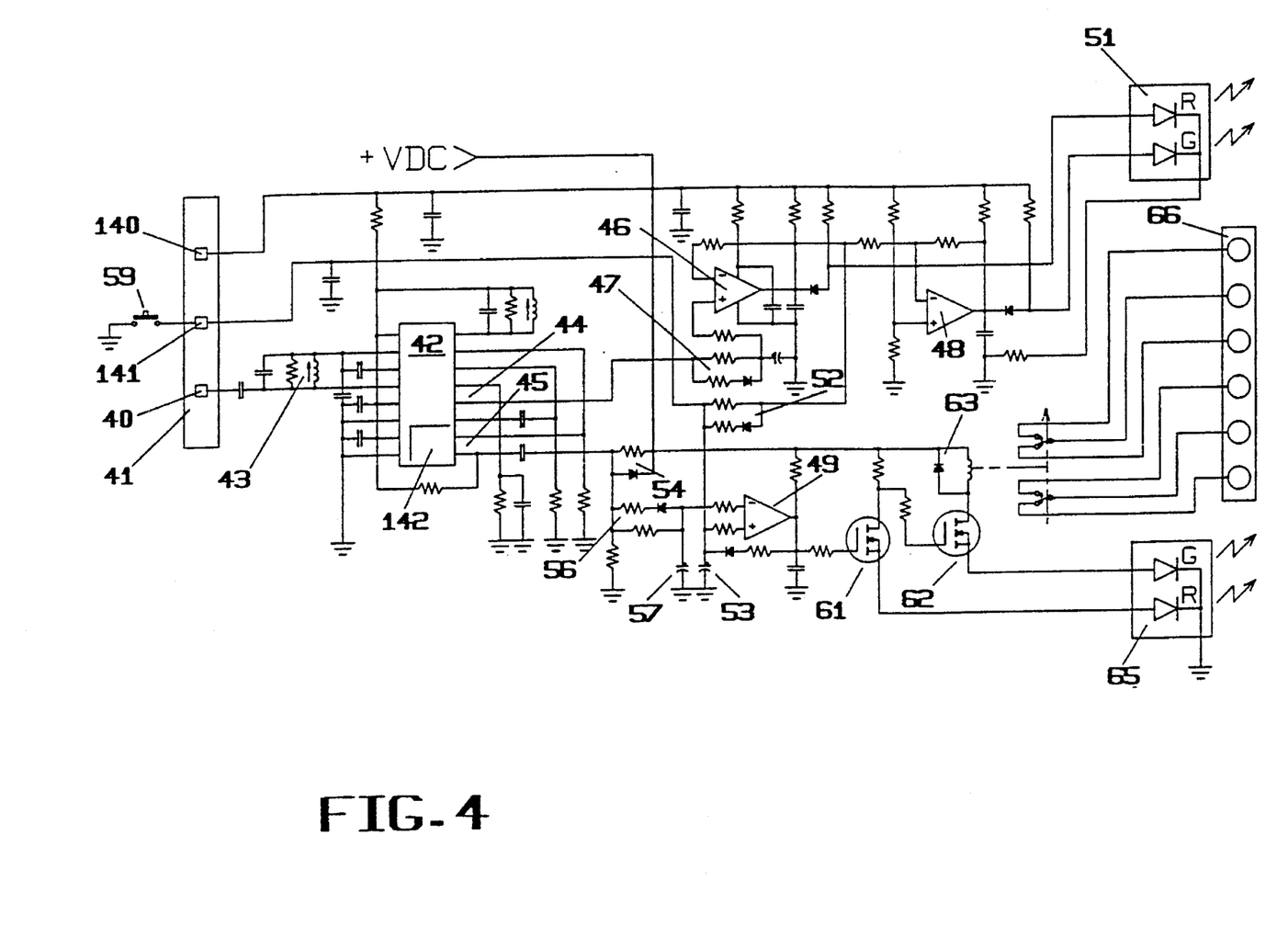
FIG. 4 is a block diagram of a receiver-demodulator, timing logic, arid relay/LED driver assembly according to an embodiment of the invention for arc detection and damage prevention.

The processed 10.7 MHz output from the bandpass filter 39 is applied via a terminal 40 to an integrated circuit frequency shift keying (FSK) receiver-demodulator 42 shown in FIG. 4. The signal is coupled to the FSK receiver through a controlled "Q" tuned circuit 43 centered at 10.7 MHz for additional off-frequency signal rejection. A positive supply voltage is supplied via a terminal 140. The terminals 40 and 140 are shown in FIGS. 3 and 4 on terminal boards designated as 41 in both figures. Actually, 41 may be one and the same terminal board in both figures, and may contain the extra terminal for the reset 59 shown in FIG. 4.

The output of the FSK receiver-demodulator 42 appears in two forms, at an output 44, a DC proportional to signal level, and at an output 45 a demodulated white noise AC component. The signal level at output 44 does not respond to transient pulse inputs, and there is no AC component at output 45 if an extraneous continuous wave radio signal finds its way into the receiver. That receiver 42 provides its carrier level DC output at 44, and includes a quadrature detector 142 that produces a white noise output at 45 as a result of frequency or phase offsets produced by the balanced mixer 37.

The carrier level DC from receiver output 44 is applied to a voltage follower 46 through the dual time constant circuit 47. The positive-going voltage follower output drives an inverter 48 and the noninverting input of a comparator 49. The combined outputs of the follower 46 and the inverter 48 drive the two-color LED 51. This LED is normally green but will transition through orange to red as the length and/or severity of an arc event increases. This LED 51 is referred to as the "arc event indicator".

The second output of the follower 46 is applied to the noninverting input of the comparator 49 through a dual time constant network 52 including a capacitor 53. The demodulated white noise AC component from the output 45 of the receiver 42 is AC coupled and clamped at 54 to provide a negative-going DC proportional to the amplitude of the demodulated noise. It may be recalled in this respect that the quadrature detector within the integrated circuit receiver 42 produces white noise output at 45 as a result of frequency or phase offsets produced by the balanced mixer 37. The negative-going DC which is proportional to demodulated noise amplitude is applied to dual time constant network 56 which includes a capacitor 57 and which drives the inverting input of comparator 49.

To toggle and latch the comparator 49 both DC inputs must be present and cross through the DC level of the other. The rate at which the DC levels charge and discharge the capacitors 53 and 57 associated with each input is determined by the dual RC time constants of networks 52 and 56. These values are different for various end result requirements. When the comparator 49 is toggled and latched, it is reset by applying ground to pin 141 of connector 41, such as with a pushbutton 59.

During normal operation the output of the comparator 49 is low. This output is coupled to the gate of a field-effect transistor (FET) 61. The drain of that FET is high and is coupled to the gate of another FET 62. With its gate held high, FET 62 is saturated and a relay 63 is energized. The sources of both FET 61 and FET 62 are connected to a dual-color LED 65. This LED is the arc alarm indicator and is green during normal operation, turning to red when an arc alarm occurs. During the arc alarm condition, current through the green half of LED 65, FET 62 and relay 63 is interrupted causing the green half of the LED 65 to extinguish and relay 63 to de-energize. The comparator 49 changed state, its output goes high causing FET 61 to saturate and operate the red half of LED 65. When the comparator 49 is reset, such as by depressing pushbutton 59, the circuits will return to their normal state.

The box 66 may either be a terminal board to which alarm devices, such as bells, horns, circuit interruptors or power cut-off switches may be connected, or may be symbolic of such alarm devices, interruptors or switches themselves.

In either case, the arc 12 or other potentially damaging arcs detected by the illustrated circuitry or otherwise within the scope of the invention, may be safely terminated before any serious damage has been done.

As a particular advantage, the illustrated embodiment enables the operator to assess the seriousness of the arc. Insignificant arcs will not trigger an alarm, but will nevertheless change the color of the LED 51 to orange. In systems where the alarm condition does not shut down the power supply or disconnect the arcing circuit, the operator can tell from the color of the LED 51, whether the arc is serious or is Just of temporary nature.

It is a further advantage of the subject invention that embodiments thereof may be implemented with standard components. For instance, the receiver-demodulator 42 may be a Wideband FSK Receiver of the IC type MC13055 described, for instance, in the MOTOROLA Linear and Interface Integrated Circuits Catalog (1988), pp. 8–65 to 8–70. In that case, the output 44 may be the Carrier Detect pin 13, and the output 45 may be the Data Output pin 16, with the order of the other pins shown on the latter page 8–65 being in effect reversed up and down in the showing of FIG. 4. Reference may also be had to that MOTOROLA Circuits Catalog, pp. 2–57 to 2–60, for an example of an implementation of components 46, 48 and 49 from the Quad Single Supply Comparators IC type LM139, A.

Similarly, reference may be had to the RF/IF Signal Processing Guide by Mini-Circuits (SF-89/90), for an example of a mixer at 37, in the form of the Frequency Mixer, Type SBL-1 on page 18, for an example of components 28 and 31 in the form of Amplifiers of the IC type MAN-1 on pages 38 and 39, for an example of components 26 and 32 in the form of RF Transformers on pages 52 and 53, and for an example of components 21, 27, 29, 33 and 34 in the form of High Pass Filters of the Type PHP-50 shown on page 61. The bandpass filter 39 may be the bandpass filter PBP-10.7 (MHz) made by the same company and described, for instance in Microwaves & RF (July 1990).

However, the scope of the invention is not limited to specific apparatus. For instance, one or more of the filters shown in the drawings may be omitted, if a reduction in noise rejection can be tolerated, or if noise rejection is effected in another manner. Similarly, the components 32, 33 and 34 constitute a radio frequency signal duplicator having an input coupled to a source of the spectrum to be detected, a first output at 33 for one spectrum as duplicated by that duplicator, and a second output at 34 for the other spectrum as duplicated by that duplicator. The scope of the invention is of course not limited to the use of such components.

The radio frequency mixer 37 has a first radio frequency input 35 coupled to the first output of the signal duplicator, a Second radio frequency input 36 coupled to the second output of the signal duplicator, and a radio frequency mixer output 38 for a combination of radio frequencies applied to said first and second inputs, which may, for example, be the difference frequency of distinct instantaneous radio frequencies in the noise spectrum or in the arc signature. However, another kind of frequency converter may be used instead of these illustrated components within the scope of the invention. As is well known, non-linear elements have been employed for frequency mixing or conversion purposes.

The frequency combination detector 42 has an input, such as at 43, coupled to the radio frequency mixer output 37, and includes an output 44 for a detected difference or other combination of the distinct instantaneous radio frequencies indicative of the electric arc or other noise.

As apparent from this disclosure, various means have been disclosed for substantially eliminating extraneous radio frequency interference, including, for example, high pass filters 21, 27 and/or 29 between the source 12 and the radio frequency duplicator input at 32, having a passband above the difference frequency or other detected combination of the distinct instantaneous radio frequencies. Other means for substantially eliminating extraneous radio frequency interference include the balanced nature and operation of the mixer 37 or other frequency converter and/or the passband filter 39 between the radio frequency mixer output 38 and the frequency combination detector or receiver-demodulator input, having a passband at the difference frequency or other detected combination of the distinct instantaneous radio frequencies.

FIG. 4 further discloses means connected to the frequency combination detector or radio frequency receiver-demodulator 42 for indicating an occurrence of the arc signature or other spectrum. For instance, in addition to the follower 46, inverter 48 and LED 51, or as an alternative thereto, the follower 46, comparator 49, relay 63 and/or LED 65 connected to the radio frequency receiver-demodulator 42 provide an alarm condition in response to occurrence of the arc signature or other spectrum.

The frequency combination detector may include first means 42 for generating a first signal proportional to a signal level at the mixer output 38, and second means 142 for generating a second signal in response to frequency or phase offsets in the radio frequency mixer 37. The apparatus includes third means, such as 46, 47, 48, 51, connected to the first means 42 for indicating an occurrence of the arc signature or other spectrum, and fourth means, such as 49, 52, 61, 62, 63, 65, 66, connected to the first and to at least one of the second and third means for providing an alarm condition in response to occurrence of the arc signature or other spectrum.

If the source is an electric arc 12 providing the radio frequency noise to be detected, then means are provided for coupling that radio frequency noise to the radio frequency duplicator or transformer input 25. In principle, an antenna could be used for that purpose. However, to reduce exposure to radio frequency interference, a ferrite core transformer 10 preferably is connected between the arcing circuit 13 or other source and the radio frequency duplicator input or wide band transformer input 25.

Figure 5:
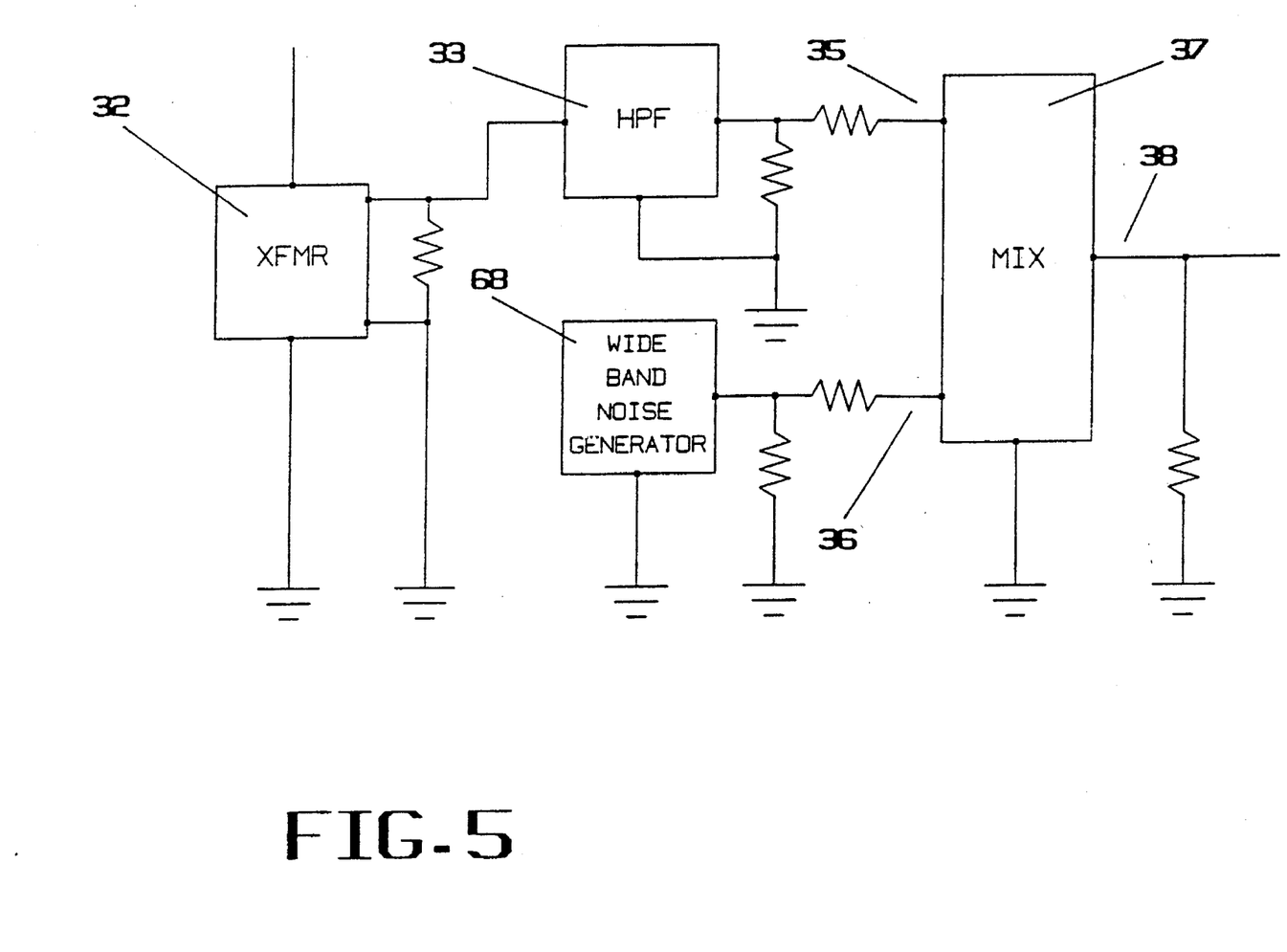
FIG. 5 is a block diagram of an alternative embodiment of the invention which may, for instance, be used in the apparatus of FIG. 3.

FIG. 5 shows an alternative that may be used within the scope of time subject invention when highest performance is not required. Instead of duplicating the radio frequency noise as at 34 in FIG. 3, the circuit of FIG. 5 generates a wide band noise signal also including distinct radio frequencies like the above mentioned radio frequency noise containing a spectrum of a broad band of distinct instantaneous radio frequencies. A wide band noise generator 68 may be substituted for that purpose for the filter 34 in the above mentioned other of the two paths between the transformer 32 and the mixer 37. In this case, there is only one path for the picked-up radio frequency noise from the transformer 32 through the filter 33 to the first mixer input 35, while the second mixer input 36 is supplied by the wide band noise from the generator 68. Any kind of wide band noise generator may be employed, as long as it provides the above mentioned distinct radio frequencies, as is generally the case with noise diodes and the like.

The above mentioned mixer also shown in FIG. 5 this time mixes the radio frequency noise from the transformer 32 with the wide band noise signal from the generator 68 to produce a difference or other combination of a multitude of distinct instantaneous radio frequencies at the mixer output for detection of the arc or other arc signature or other radio frequency spectrum, such as in FIG. 4. In other words, except for the substitution of the wide band noise generator 68 for the high pass filter 34 and time grounding of the lower output of transformer 32, the circuitry may be the same as in FIGS. 3 and 4, with or without FIG. 2.

In FIG. 1, the occurrence of an arc in a broken conductor 13 or between conductors has been stressed. However, the arc 12 symbolically shown in FIG. 2 may, for instance, signify excessive arcing at a rotary commutator, in a contactor or in other electrical components. In such cases, too, the circuitry of FIGS. 2, 3, 4 or 5 may be used to detect such excessive arcing. The LED 51 may be used to indicate excessive arcing, while the relay 63 may be used to shut off the motor, contactor or other component before the commutator has been worn, the contactor burned or the electrical component otherwise damaged. Remedial action may then be taken before operation is resumed.

The subject extensive disclosure will render apparent or suggest to those skilled in the art various other modifications and variations within the spirit and scope of the subject invention and equivalents thereof.

We claim:

1. A method of detecting a signal having a spectrum of a broad band of distinct instantaneous radio frequencies in radio frequency noise, comprising in combination:

converting a multitude of said distinct instantaneous radio frequencies into a combination frequency of said distinct instantaneous radio frequencies while rejecting extraneous narrow-band signals having frequencies within said broad band, by duplicating said radio frequency noise into two paths, and by mixing the radio frequency noise from one of said two paths with the radio frequency noise from the other of said two paths to produce said combination frequency of a multitude of said distinct instantaneous radio frequencies; and detecting said signal having said spectrum from said combination frequency in contradistinction to said extraneous narrow-band signals.

2. A method as in claim 1, including:

substantially eliminating from said radio frequency noise components corresponding in frequency to said combination frequency indicative of said spectrum.

3. Apparatus for detecting a signal having a spectrum of a broad band of distinct instantaneous radio frequencies in radio frequency noise, comprising in combination:

means for converting a multitude of said distinct instantaneous radio frequencies into a combination frequency of said distinct instantaneous radio frequencies, while rejecting extraneous narrow-band signals having frequencies within said broad band;

said converting means including two noise signal paths, means for duplicating said radio frequency noise into said two paths, and means for mixing the radio frequency noise from one of said two paths with the radio frequency noise from the other of said two paths; and means connected to said converting means for detecting said spectrum from said combination frequency, including means for detecting from the mixed radio frequency noise said combination frequency of a multitude of said distinct instantaneous radio frequencies indicative of said signal having said spectrum, in contradistinction to said extraneous narrow-band signals.

4. Apparatus as in claim 3, including:

means for substantially eliminating components from said radio frequency noise corresponding in frequency to said combination frequency indicative of said signal having said spectrum.

5. A method as in claim 1 or 2, including:

generating a first signal proportional to a signal level of said combination frequency;

generating a second signal in response to frequency or phase offsets produced by the conversion;

indicating an occurrence of said signal having said spectrum in response to said first signal; and generating an alarm condition from a comparison of said first an second signals.

6. A method as in claim 1 or 2, wherein:

said signal having a spectrum of a broad band of distinct instantaneous radio frequencies is generated by an electric arc; and an occurrence of said arc is detected by detecting said combination frequency of a multitude of said distinct instantaneous radio frequencies from said broad band of distinct instantaneous radio frequencies generated by said electric arc.

7. A method of detecting a signal having a spectrum of a broad band of distinct instantaneous radio frequencies in radio frequency noise including extraneous narrow-band signals having frequencies within said broad band, comprising in combination:

deriving from said signal having said spectrum of a broad band of distinct instantaneous radio frequencies in radio frequency noise a wide band noise signal also including distinct radio frequencies;

mixing said radio frequency noise with said wide band noise signal to produce a signal having a combination frequency of a multitude of distinct instantaneous radio frequencies; and detecting said signal having said spectrum from said combination frequency in contradistinction to said extraneous narrow-band signals.

8. A method as in claim 1 or 2, wherein:

said combination frequency is a difference frequency of said multitude of distinct instantaneous radio frequencies detected from said radio frequency noise.

9. Apparatus as in claim 3 or 4, wherein:

said detecting means include means for detecting a difference frequency of said multitude of distinct instantaneous radio frequencies as said combination frequency detected from said radio frequency noise.

10. A method as in claim 7, including:

substantially eliminating from said radio frequency noise components corresponding in frequency to said combination frequency indicative of said spectrum.

11. Apparatus for detecting a signal having a spectrum of a broad band of distinct instantaneous radio frequencies in radio frequency noise including extraneous narrow-band signals having frequencies within said broad band, comprising in combination:

a wide band noise signal path having an input for a version of said radio frequency noise;

a radio frequency mixer having a first input for said radio frequency noise, and a second input connected to said wide band noise signal path for said version of said radio frequency noise, and an output for a signal having a combination frequency of a multitude of distinct instantaneous radio frequencies from said radio frequency noise and from said version of said radio frequency noise; and a frequency combination detector having an input coupled to said radio frequency mixer output, and having an output for a signal indicative of a detected combination of said distinct instantaneous radio frequencies in contradistinction to said extraneous narrow-band signals.

12. Apparatus as in claim [32 or 11, including:

means for substantially eliminating components from said radio frequency noise corresponding in frequency to said combination frequency indicative of said detected combination of distinct instantaneous radio frequencies.

13. Apparatus as in claim 11 or 12, where in:

said frequency combination detector is a difference frequency detector.

14. Apparatus as in claim 11 or 12, wherein:

said output of the frequency combination detector includes a first output for a first signal proportional to a signal level at said radio frequency mixer output and a second output for a second signal representing frequency or phase offsets in said radio frequency mixer.

15. Apparatus as in claim 11 or 12, wherein:

said frequency combination detector is a radio frequency receiver-demodulator.

16. Apparatus as in claim 15, including:

means connected to said radio frequency receiver-demodulator for indicating an occurrence of said signal indicative of a detected combination of distinct instantaneous radio frequencies.

17. Apparatus as in claim 15, including:

means connected to said radio frequency receiver-demodulator for providing an alarm condition in response to occurrence of said signal indicative of a detected combination of distinct instantaneous radio frequencies.

18. Apparatus as in claim 11 or 12, including:

means for deriving said signal having a spectrum of a broad band of distinct instantaneous radio frequencies in radio frequency noise from an electric arc.

19. A method as in claim 7 or 10, wherein:

said combination frequency is a difference frequency of said multitude of distinct instantaneous radio frequencies detected from said radio frequency noise.

20. A method as in claim 7 or 10, including:

generating a first signal proportional to a signal level of said combination frequency;

generating a second signal in response to frequency or phase offsets produced by the conversion;

indicating an occurrence of said spectrum in response to said first signal; and generating an alarm condition from a comparison of said first and second signals.

21. A method as in claim 7 or 10, wherein:

said signal having said spectrum of a broad band of distinct instantaneous radio frequencies is generated by an electric arc; and an occurrence of said arc is detected by detecting said combination frequency of a multitude of said distinct instantaneous radio frequencies from said broad band of distinct instantaneous radio frequencies generated by said electric arc.

* * * * *

UNITED STATES PATENT AND TRADEMARK OFFICE
CERTIFICATE OF CORRECTION

PATENT NO. : 5,477,150

DATED : December 19, 1995

INVENTOR(S) : Howard M. Ham, Jr. and James J. Keenan

It is certified that error appears in the above-indentified patent and that said Letters Patent is hereby corrected as shown below:

On the title page, delete item:

"[30] Foreign Application Priority Data
Oct. 24, 1990 [EP] European Pat. Off...90917578"

and substitute therefor:

-- [62] Division of ser. No. 30,279, Mar. 18, 1993, which was the national stage of international application number PCT/US90/06113, on Oct. 24, 1990, Pat. No.5,373,241--.

ABSTRACT, line 12, "tile" should be --the--, and in line 16, insert --a-- before "multitude";
Col. 1, line 51, "8" should be --1--;
Col. 3, line 4, "arid" should be --and--;
Col. 4, line 29, "red,ice" should be --reduce--;
Col. 4, line 56, "are" should be --arc--;
Col. 5, line 8, "ccnverter" should be --converter--;
Col. 6, line 49, "Just" should be --just--;
Col. 7, line 22, "Second" should be --second--;
Col. 8, line 17, "time" should be --the--;
Col. 8, line 42, "time" should be --the--;

UNITED STATES PATENT AND TRADEMARK OFFICE
CERTIFICATE OF CORRECTION

PATENT NO. : 5,477,150
DATED : December 19, 1995
INVENTOR(S) : Howard M. Ham, Jr. and James J. Keenan It is certified that error appears in the above-indentified patent and that said Letters Patent is hereby corrected as shown below:

Col. 10, line 46, cancel "32 or".

Signed and Sealed this

Thirty-first Day of December, 1996

Attest:

BRUCE LEHMAN

Attesting Officer

Commissioner of Patents and Trademarks